United States Patent
Mardi

(10) Patent No.: US 8,269,519 B1
(45) Date of Patent: Sep. 18, 2012

(54) METHODS AND APPARATUS FOR TESTING OF INTEGRATED CIRCUITS

(75) Inventor: Mohsen Hossein Mardi, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 743 days.

(21) Appl. No.: 12/368,853

(22) Filed: Feb. 10, 2009

(51) Int. Cl.
*G01R 31/20* (2006.01)
(52) U.S. Cl. .............. 324/758.04; 324/758.01
(58) Field of Classification Search ............. 324/758.01
See application file for complete search history.

(56) References Cited

U.S. PATENT DOCUMENTS

| | | | | |
|---|---|---|---|---|
| 3,761,808 A | * | 9/1973 | Ryan | 324/537 |
| 5,644,249 A | * | 7/1997 | Kister | 324/750.25 |
| 5,977,783 A | * | 11/1999 | Takayama et al. | 324/755.01 |
| 6,057,694 A | * | 5/2000 | Matsudo | 324/754.11 |
| 6,352,595 B1 | * | 3/2002 | Svirchevski et al. | 134/3 |
| 6,521,536 B1 | * | 2/2003 | Robinson | 438/692 |
| 6,781,395 B2 | * | 8/2004 | Maruyama et al. | 324/758.01 |

* cited by examiner

*Primary Examiner* — Paresh Patel
(74) *Attorney, Agent, or Firm* — Robert M. Brush; Gerald Chan

(57) ABSTRACT

Methods and apparatus for testing packaged ICs are disclosed. In some embodiments, an apparatus for testing a packaged integrated circuit (IC) can include a device handler for moving the packaged IC; a testing station for testing the packaged IC; and a pre-test conditioning station configured to remove at least a portion of an oxidation layer formed on contacts of the packaged IC prior to testing. In some embodiments, a method for testing packaged ICs may include providing a packaged IC to be tested; at least partially removing an oxidation layer from contacts of the packaged IC prior to testing; inserting the packaged IC into an interface structure; and testing the packaged IC.

13 Claims, 3 Drawing Sheets

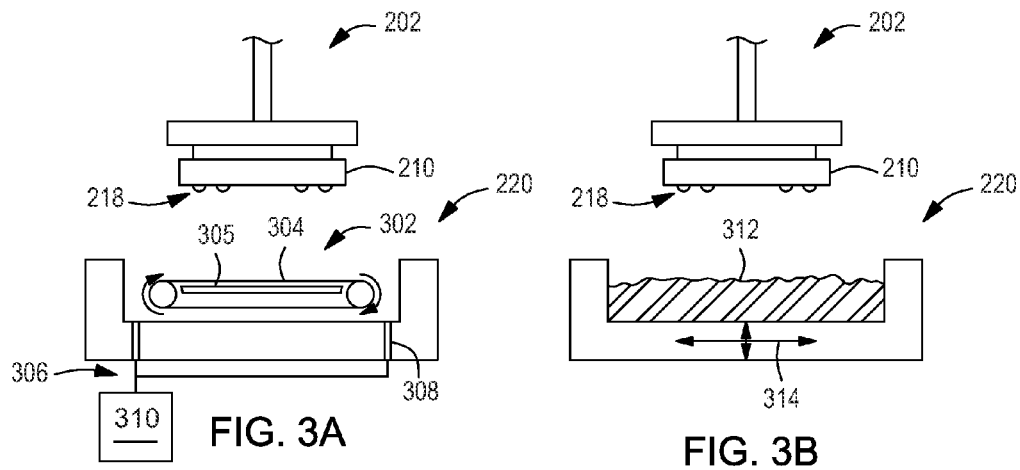
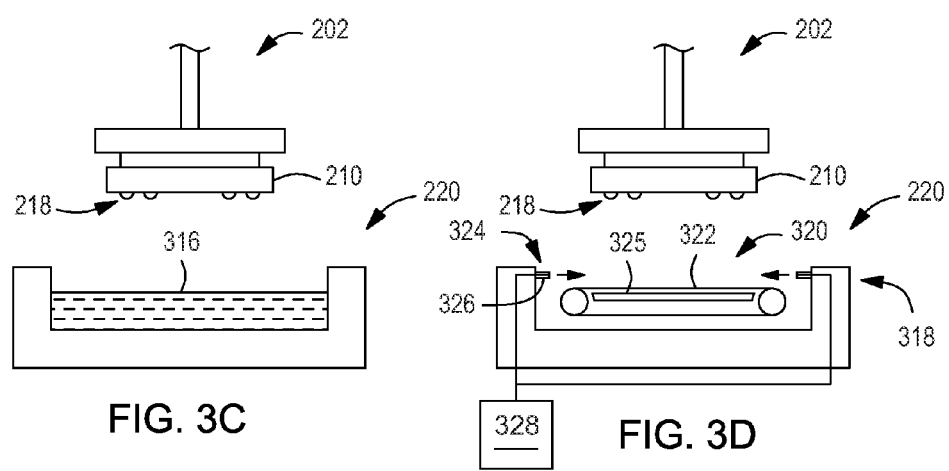
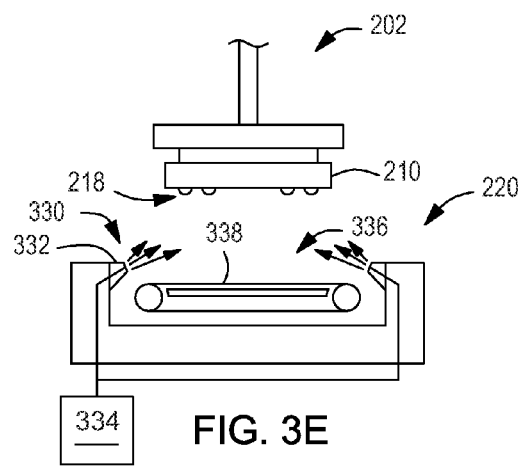

METHODS AND APPARATUS FOR TESTING OF INTEGRATED CIRCUITS

FIELD OF THE INVENTION

One or more aspects of the present invention relate generally to integrated circuits (ICs) and, more particularly, to methods and apparatus for testing of ICs.

BACKGROUND OF THE INVENTION

Integrated circuit (IC) manufacturers typically test their IC packages before shipping to customers using IC testing systems. A typical IC testing system 100, depicted in FIG. 1, includes a device handler 102, an interface structure 104, a device tester 106, and a computer 108. The device handler 102 is a precise robot that is utilized to move a device under test (DUT) 110, such as a packaged IC device, to, from, and within the testing system 100 (for example, between a storage area and the interface structure 104).

The interface structure 104 includes a printed circuit board (PCB) 112 having a socket 114 located in a central test area. The PCB 112 is of a size and shape that allows it to be received into a docking area of the device tester 106. The socket 114 includes a plurality of compressible pins such as pogo pins 116 arranged so as to contact corresponding balls 118 of the DUT 110 (e.g., the arrangement of pogo pins 116 of the socket 114 corresponds to the arrangement of balls 118 of the DUT 110).

The PCB 112 includes conductive contacts (not shown) disposed on a bottom surface thereof. The conductive contacts couple corresponding pogo pins 116 of the socket 114 to a plurality of test probes (not shown) of the device tester 106 by conductive lines 122 (e.g., metal traces). The plurality of test probes provide test signals to the interface structure 104, which in turn transmits signals between the device tester 106 and the leads (e.g., solder balls 118) of the DUT 110.

The computer 108 is coupled to the device tester 106. The computer 108 may be, for example, a personal computer (PC) (also referred to as, ATE, or Automatic Test equipment) or other suitable controller for controlling the testing system 100 and includes well-known testing software residing in memory (e.g., a system memory or a hard disk). The testing software provides test and control signals to device tester 106 according to test parameters associated with the DUT 110. The test parameters may be stored in a file located in computer memory, or may be input into the computer 108 using any suitable input device such as, for example, a keyboard (not shown).

In operation, the DUT 110 is mounted on the socket 114 (for example, using the device handler 102) so that the solder balls 118 contact the pogo pins 116 of the socket 114. However, by the time the DUT 110 reaches the test area for testing, the solder balls 118 typically have a layer of oxidation formed thereon that needs to be broken in order to make good electrical contact therewith and to test the DUT 110. The oxidation layer is typically broken by applying a high force between the device handler 102 pressing the DUT 110 into the socket 114 and by utilizing pogo pins 116 having a high spring constant. However, such high forces results in excessive wear on the testing system 100 components, such as mechanical failure of the device handler 102 and/or the socket 114. Moreover, in testing systems designed to handle multiple DUTs 110, the forces required to overcome the oxidation layer is multiplied and the testing system equipment is thus subject to even higher forces. Such forces may result in premature failure of the equipment as discussed above, or require expensive redesign of the testing system to avoid such failure.

Accordingly, there exists a need in the art for improved methods and apparatus for testing ICs.

SUMMARY OF THE INVENTION

Methods and apparatus for testing packaged ICs are provided herein. In some embodiments, an apparatus for testing a packaged integrated circuit (IC) can include a device handler for moving the packaged IC; a testing station for testing the packaged IC; and a pre-test conditioning station configured to remove at least a portion of an oxidation layer formed on contacts of the packaged IC prior to testing.

The device handler can move the packaged IC between the pre-test conditioning station and the testing station. The testing station includes a device interface having a socket configured to receive the contacts of the packaged IC, a device tester having test probes for connecting with the contacts of the packaged IC through the device interface, and a computer to control testing of the packaged IC.

The pre-test conditioning station removes at least a portion of the oxidation layer via at least one of abrasion, agitation in a slurry or aggregate media, polishing, dipping in a de-oxidizing liquid bath, or spraying with a de-oxidizing liquid. The pre-test conditioning station includes an abrading mechanism configured to interface with the contacts of the packaged IC. The pre-test conditioning station further includes an air handling system to provide a flow of air to remove particulate residue. The air handling system includes a vacuum source coupled to an inlet disposed proximate to the abrading mechanism.

The pre-test conditioning station further includes an agitator having abrasive media configured to interface with the contacts of the packaged IC. The agitator further includes a bed of a slurry or a loose aggregate. The pre-test conditioning station includes a bath configured to interface with the contacts of the packaged IC, where the bath has a de-oxidizing liquid contained therein. The pre-test conditioning station further includes a polishing and/or drying mechanism to remove any liquid from the contacts of the packaged IC. The polishing and/or drying mechanism further includes an air handling system to provide a flow of air across the contacts of the packaged IC.

The pre-test conditioning station further includes a heating and/or cooling plate configured to interface with the contacts of the packaged IC. The pre-test conditioning station further includes a spray system configured to spray a de-oxidizing liquid from the contacts of the packaged IC; and a polishing/drying system to remove any excess liquid from the contacts of the packaged IC after spraying.

In some embodiments, a method for testing packaged ICs may include providing a packaged IC to be tested; at least partially removing an oxidation layer from contacts of the packaged IC prior to testing; inserting the packaged IC into an interface structure; and testing the packaged IC. The element of at least partially removing the oxidation layer further includes placing the packaged IC in a pre-test conditioning station configured to at least partially remove the oxidation layer from contacts of the packaged IC.

The method further includes moving the packaged IC from the pre-test conditioning station to the interface structure using a device handler. The element of inserting the packaged IC into the interface structure further includes connecting a de-oxidized portion of the contacts to a socket of the interface structure. In addition, the element of inserting the packaged IC into the interface structure further includes applying a force of less than about 1.2 oz. against the packaged IC to engage the contacts of the packaged IC against a socket of the interface structure.

The element of inserting the packaged IC into the interface structure further includes applying a force of between about 0.8 oz to about 1.2 oz. against the packaged IC to engage the contacts of the packaged IC against a socket of the interface structure.

BRIEF DESCRIPTION OF THE DRAWINGS

The accompanying drawing(s) show embodiment(s) in accordance with one or more aspects of the invention. However, the accompanying drawing(s) should not be taken to limit the invention to the embodiment(s) shown, but are for explanation and understanding only.

FIGS. 3A-E are embodiments of a pretest conditioning station according to some embodiments of the invention.

DETAILED DESCRIPTION OF THE DRAWINGS

Methods and apparatus for testing integrated circuits (ICs) are provided herein. The inventive methods and apparatus advantageously facilitate, e.g., testing packaged ICs with little or no oxidation formed on leads (e.g., solder balls) of the package. The inventive methods and apparatus thus facilitate, e.g., providing improved electrical contact to the leads with less pressure and resultant wear on testing system components. The inventive methods and apparatus further facilitate, e.g., less expensive design due to lower forces being required to make such electrical contact.

Figure 1:
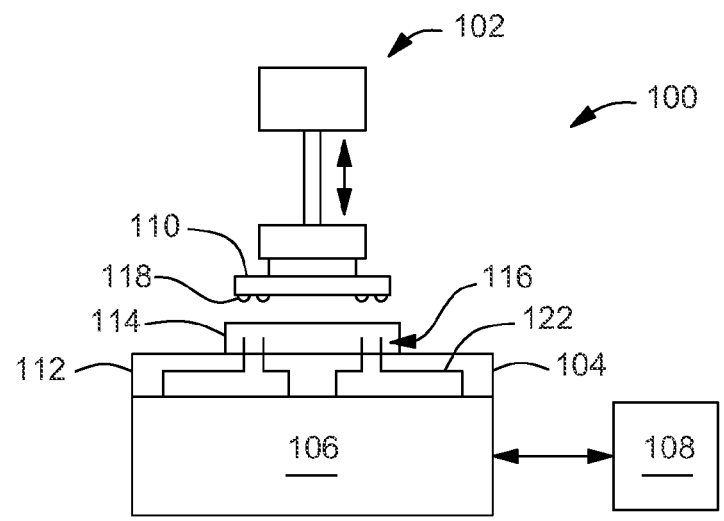
FIG. 1 is a schematic diagram depicting a conventional integrated circuit (IC) testing system.
Figure 2:
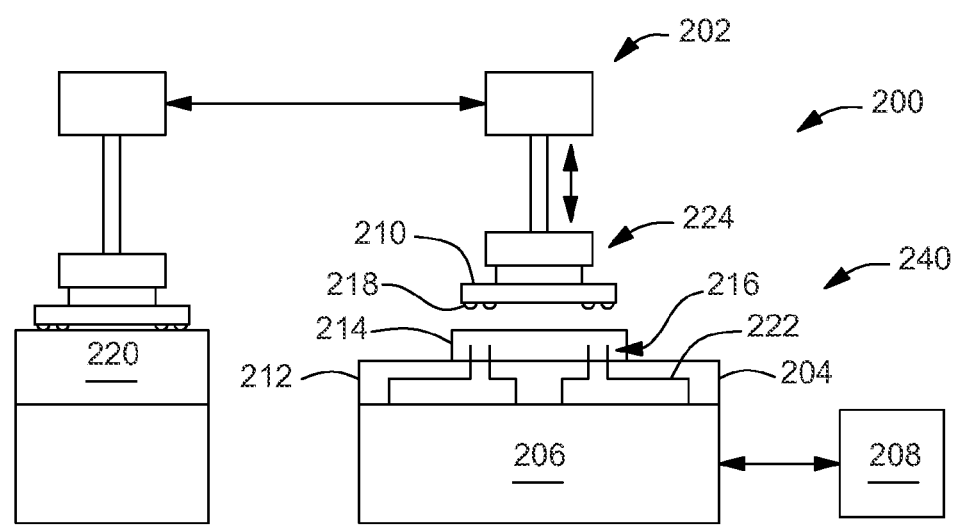
FIG. 2 is a schematic diagram depicting an integrated circuit (IC) testing system according to some embodiments of the invention.

FIG. 2 depicts an IC testing system 200 in accordance with some embodiments of the present invention. As shown in FIG. 2, the IC testing system 200 includes a device handler 202, a pre-test conditioning station 220, and a testing station 240. The device handler 202 is a precision movable robot configured to position a device under test (DUT) 210, such as a packaged IC device, to, from, and within the testing system 200 (for example, between a storage area and the interface structure 104). The device handler 202 is generally movable in at least an x and z direction (e.g., horizontally and vertically), and optionally, in a y direction (e.g., horizontally in a direction normal to the x direction). The device handler 202 includes a pickup head 224 configured to detachably couple to the backside of the DUT 210 (for example, by vacuum). The device handler 202 may be utilized to pick up the DUT 210 with the pickup head 224 and moves the DUT 210 to a desired position in the testing system 200.

The pre-test conditioning station 220 is configured to clean (e.g., remove) at least a portion of a native oxidation layer that may form on the leads (e.g., balls 218) of the DUT 210. In some embodiments, cleaning or removing at least a portion of the native oxidation layer may include removing between about 20 to about 50 Angstroms of material from the balls 218. The pre-test conditioning station 220 may be disposed in any convenient location for cleaning the balls 218 of the DUT 210 prior to testing. Although no particular timeframe is required, the balls 218 should be cleaned suitably close to the testing time to prevent or limit re-oxidation of the balls 218. As such, if the balls 218 may be kept clean (de-oxidized) by storing the DUT 210 appropriately (for example, in a non-oxidizing atmosphere), then the balls 218 may be cleaned at any time prior to testing. In some embodiments, the balls 218 may be cleaned in the pre-test conditioning station 220 just prior to testing (e.g., put in queue for testing immediately following cleaning).

In some embodiments, and as shown in FIG. 2, the pre-test conditioning station 220 may positioned in a location that is accessible by the device handler 202. Alternatively, the pre-test conditioning station 220 may be positioned elsewhere and the conditioned DUT 210 may be delivered to a location accessible by the device handler 202 for testing.

The pre-test conditioning station 220 may be configured to clean at least a portion of the oxidized balls 218 of the DUT 210 in any suitable manner. In some embodiments, at least a lower portion of the balls 218 are cleaned. The lower portion of the balls 218 generally corresponds to locations where the balls 218 are to make connection with other components of the testing system (such as pogo pins 216, discussed below). For example, in some embodiments, about 1/16 of a mil or less of the lower portion of the balls 218 may be cleaned prior to testing. Alternatively, the balls 218 may be completely cleaned.

FIGS. 3A-E depict non-limiting examples of some suitable embodiments of the pre-test conditioning station 220. For example, FIG. 3A depicts a pre-test conditioning station 220 having an abrading mechanism 302 for mechanically removing the oxidation layer from the balls 218 via abrasion. In the embodiment depicted in FIG. 3A, the abrading mechanism 302 includes a polishing belt 304 having an abrasive surface of appropriate grit to remove the oxidation layer from the balls 218 when the balls 218 are pressed against a platen 305 (for example, by the device handler 202) having the polishing belt 304 disposed thereon. The polishing belt 304 may comprise metal, plastic, paper, cloth, or the like, and is typically static dissipative to prevent buildup and/or discharge of static electricity that could damage the DUT 210. For example, in some embodiments, the polishing belt 304 may be a cotton cloth, or other cloth that does not create an electrostatic charge. In some embodiments, the polishing belt 304 may be rotated at a low speed, such as at less than about 2 inches per second, or between about 1 to about 2 inches per second, to prevent damage to the balls 218. Although shown in FIG. 3A as belt, the polishing media (e.g., the polishing belt 304) may alternatively be a disc provided on a rotating platen, or may move back and forth in an agitating motion, rather than in the continuous linear motion provided by the belt.

In some embodiments, particulate residue from the cleaning process may be removed by, for example, an air handling system 306 that moves air past the balls 218 and/or within the pre-test conditioning station 220 to remove the residue. For example, in some embodiments, the air handling system 306 may include a vacuum source 310 coupled to the pre-test conditioning station 220 via one or more inlets 308 to vacuum out the residue. Alternatively, the vacuum source 310 may be replaced with a blower to provide air into the pre-test conditioning station 220.

In some embodiments, and as shown in FIG. 3B, the pre-test conditioning station 220 may include an agitator. In some embodiments, the agitator may include a bed of a slurry 312 (or of a loose aggregate) that is movable to agitate the slurry 312, as indicated by arrows 314. Placing the balls 218 in the slurry 312, for example with the device handler 202, for a period of time, facilitates removal of the oxidation layer from the balls 218. In some embodiments, the slurry 312 may have a particulate size of between about 0.5 to about 9.2 micrometers. In some embodiments, the slurry 312 may comprise, for example, walnut shell powder.

In some embodiments, as depicted in FIG. 3C, the pre-test conditioning station 220 may include a bath of a de-oxidizing liquid 316 suitable to react with and/or dissolve the oxidation layer on the balls 218. Suitable de-oxidizing liquids 316 include known wet etch solutions for pad etch (e.g., silicon dioxide) applications, or the like. In embodiments where a liquid bath is provided in the pre-test conditioning station 220, the balls 218 of the DUT 210 may further require drying and/or polishing to ensure that no excess liquid is present on the DUT 210 that may interfere with testing and/or damage the DUT 210 during testing.

For example, as shown in FIG. 3D, the pre-test conditioning station 220 may include a polishing/drying mechanism 320. The polishing/drying mechanism 320 may be configured similarly to the abrading mechanism 302 depicted in FIG. 3A (e.g., a rotating belt or disc). In some embodiments, a polishing and/or drying belt 322 may be provided having a surface to polish and/or dry the balls 218 of the DUT 210. For example, in some embodiments, after being dipped in the bath of liquid 316 (as depicted in FIG. 3C), the DUT 210 may be pressed against the belt 322 to polish away any residual oxidation and/or to remove any excess liquid 316 remaining on the balls 218.

In some embodiments, an air blower system 324 may be provided to further facilitate removing any excess liquid 316. For example air may be provided from an air source 328 via one or more nozzles 328 directed at the balls 218 (or directed across the surface of the belt 322 such that the belt may be dried and the balls 218 may be dried when held in proximity to the belt 322.

Alternatively or in combination, in some embodiments, a heat source or cooling source may be provided to remove excess liquid from the balls 218 (or DUT 210) by controlling the evaporation and or condensation of the liquid. For example, a heat source (such as a resistive heater, not shown) may be provided proximate to or embedded within the platen 325 to provide additional heat to facilitate evaporation of liquid present on the balls 218 (or DUT 210). In some embodiments, a separate heating plate may be provided and the balls 218 may be placed on or near the heating plate to evaporate the liquid. Alternatively, in some embodiments, a cooling source (not shown), such as a stream of a cold gas (for example, a liquid nitrogen jet) or a cold plate may be provided to facilitate removal of liquid present on the balls 218 (or DUT 210).

In some embodiments, the pre-test conditioning station 220 may include a spray system 330 and a polishing/drying system 336. The spray system 330 may provide a de-oxidizing liquid spray to the balls 218 to react with any oxidation layer disposed thereupon. The spray system may include a de-oxidizing liquid source 334 that may be applied at a desired pressure to one or more nozzles 332 configured to spray the de-oxidizing liquid onto the balls 218 when held in position by, for example, the device handler 202. Examples of suitable de-oxidizing liquids include pad etch solutions as discussed above, or the like. Similar to the embodiments depicted in FIG. 3D, the polishing/drying system 336 may include a polishing and/or drying belt 338 having a surface configured to polish and/or dry the balls 218 of the DUT 210 after being sprayed with the de-oxidizing liquid by the spray system 330.

The above non-limiting examples of the pre-test conditioning station 220 are provided for illustration only and other embodiments are within the scope of the present invention.

For example, combinations of the above embodiments are possible, such as providing the polishing/drying mechanism 320 depicted in FIG. 3D in combination with any of the embodiments depicted in FIGS. 3A-C.

Returning to FIG. 2, in some embodiments, the testing station 240 may include an interface structure 204, a device tester 206, and a computer 208. The interface structure 204 includes a printed circuit board (PCB) 212 having a socket 214 located in a central test area. The PCB 212 is of a size and shape that allows it to be received into a docking area of the device tester 206. The socket 214 includes a plurality of compressible pins such as pogo pins 216 arranged so as to contact corresponding balls 218 of the DUT 210. The arrangement of pogo pins 216 of the socket 214 corresponds to the arrangement of balls 218 of the DUT 210. In some embodiments, the pogo pins 216 may be configured to provide a force of between about 0.8 oz to about 1.2 oz force upon compression thereof to facilitate making a reliable electrical contact with the balls 218 of the DUT 210.

The PCB 212 includes conductive contacts (not shown) disposed on a bottom surface thereof. The conductive contacts couple corresponding pogo pins 216 of the socket 214 to a plurality of test probes (not shown) of the device tester 206 by conductive lines 222 (e.g., metal traces). The plurality of test probes provide test signals to the interface structure 204, which in turn transmits signals between the device tester 206 and the leads (e.g., solder balls 218) of the DUT 210.

The computer 208 is coupled to the device tester 206. The computer 208 may be, for example, a personal computer (PC) or other suitable controller for controlling the testing station 240 and/or the entire testing system 200. The computer 208 includes testing software residing in memory (e.g., a system memory or a hard disk) for testing the DUT 210. For example, the testing software may provide test and control signals to the device tester 206 according to test parameters associated with the DUT 210. The test parameters may be stored in a file located in computer memory, or may be input into the computer 208 using any suitable input device such as, for example, a keyboard (not shown).

Figure 4:
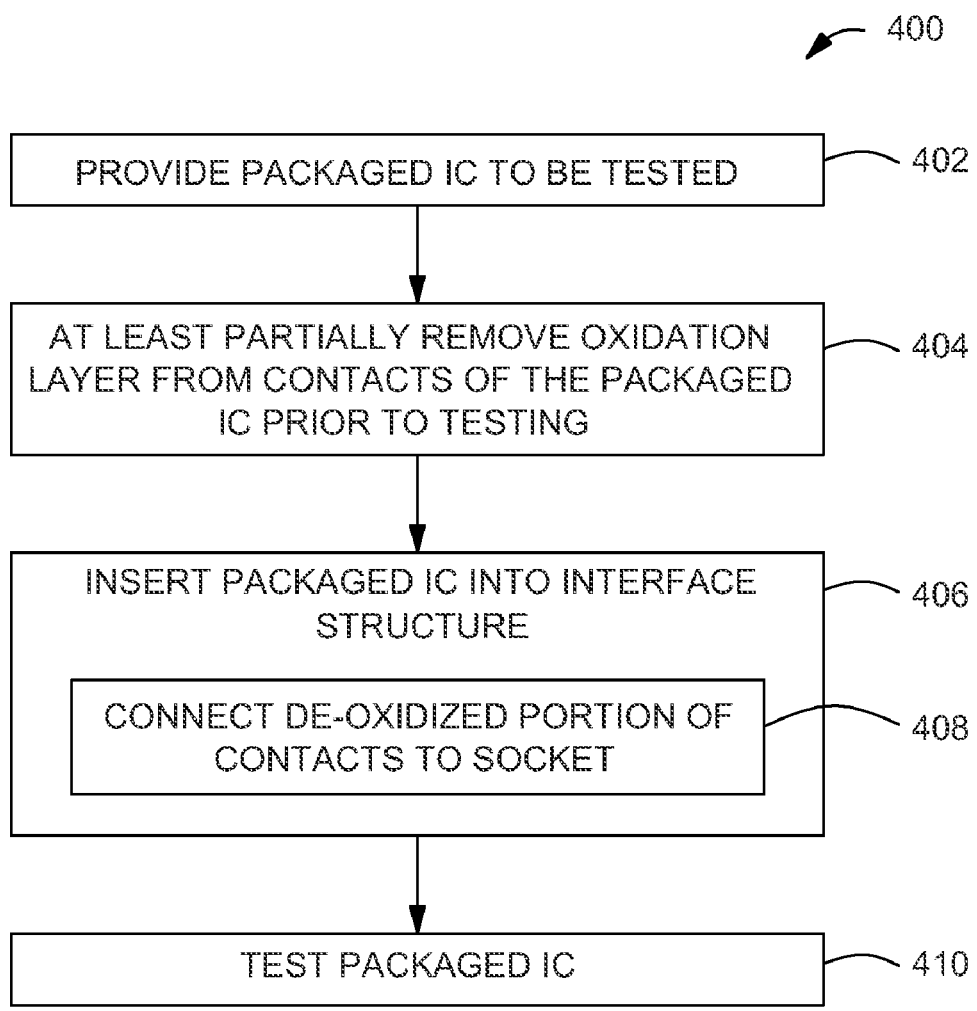
FIG. 4 is a flow diagram depicting a method for testing an integrated circuit according to some embodiments of the invention.

FIG. 4 depicts a method 400 for testing a packaged IC in accordance with some embodiments of the present invention. The method 400 generally begins at 402 where a packaged IC (e.g., the DUT 210) to be tested is provided. The packaged IC may have a pre-existing oxidation layer formed on contacts of the IC (e.g., balls 218) due, for example, from exposure to an oxidizing atmosphere (e.g., air).

Next, at 404, the oxidation layer may be at least partially removed from the contacts of the packaged IC prior to testing. The oxidation layer may be removed utilizing the pre-test conditioning station 220 in accordance with any of the embodiments disclosed herein. For example, the DUT 210 may be picked up by the device handler 202 and positioned in the pre-test conditioning station 220. The oxidation layer may be at least partially removed via at least one of abrasion, agitation in a slurry or aggregate media, polishing, dipping in a de-oxidizing liquid bath, spraying with a de-oxidizing liquid, or the like.

Upon removing a desired quantity of the oxidation layer on the contacts, at 406, the packaged IC may be placed into the device tester. For example, the DUT 210 may be moved by the device handler 202 from the pre-test conditioning station 220 to the interface structure 204. In some embodiments, labeled as 408 in FIG. 4, the device handler 202 may position the DUT 210 to connect the de-oxidized portion of the contacts (balls 218) to the socket 214 of the interface structure 204 so that the solder balls 218 contact the pogo pins 216 of the socket 214.

Next, at 410, the packaged IC can be tested, for example, using testing software residing in memory of the computer 208, as discussed above.

Thus, methods and apparatus for testing packaged ICs has been provided. The inventive methods and apparatus advantageously facilitate utilization of lower forces applied to make sufficient electrical contact to the IC package to be tested, thereby reducing stress on the system, which may lead to extended lifetime and/or system uptime, and allowing for less expensive components and construction of the system, thereby reducing cost of testing.

While the foregoing describes embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. An apparatus for testing a packaged integrated circuit (IC), comprising:
   a device handler for moving the packaged IC;
   a testing station for testing the packaged IC; and
   a pre-test conditioning station configured to remove at least a portion of an oxidation layer formed on contacts of the packaged IC prior to testing;
   wherein the pre-test conditioning station comprises a mechanically actuated belt for providing abrasion against the contacts.

2. The apparatus of claim 1, wherein the device handler moves the packaged IC between the pre-test conditioning station and the testing station.

3. The apparatus of claim 1, wherein the testing station comprises:
   a device interface having a socket configured to receive the contacts of the packaged IC;
   a device tester having a plurality of test probes for connecting with the contacts of the packaged IC through the device interface; and
   a computer to control testing of the packaged IC.

4. The apparatus of claim 1, wherein the pre-test conditioning station comprises only the mechanically actuated belt, and wherein the belt comprises an abrading mechanism configured to interface with the contacts of the packaged IC.

5. The apparatus of claim 4, wherein the pre-test conditioning station further comprises:
   an air handling system to provide a flow of air to remove particulate residue.

6. The apparatus of claim 5, wherein the air handling system comprises:
   a vacuum source coupled to an inlet disposed proximate the abrading mechanism.

7. A method for testing packaged ICs, comprising:
   providing a packaged IC to be tested;
   at least partially removing an oxidation layer from contacts of the packaged IC prior to testing;
   inserting the packaged IC into an interface structure; and
   testing the packaged IC;
   wherein the act of at least partially removing the oxidation layer comprises using a mechanically actuated belt to provide abrasion against the contacts.

8. The method of claim 7, wherein the act of at least partially removing the oxidation layer further comprises:
   placing the packaged IC in a pre-test conditioning station configured to at least partially remove the oxidation layer from contacts of the packaged IC.

9. The method of claim 8, further comprising:
   moving the packaged IC from the pre-test conditioning station to the interface structure using a device handler.

10. The method of claim 7, wherein the act of inserting the packaged IC into the interface structure further comprises:
    applying a force of less than about 1.2 oz. against the packaged IC to engage the contacts of the packaged IC against a socket of the interface structure.

11. The method of claim 7, wherein the act of inserting the packaged IC into the interface structure further comprises:
    applying a force having a value that is anywhere from 0.8 oz to 1.2 oz. against the packaged IC to engage the contacts of the packaged IC against a socket of the interface structure.

12. The apparatus of claim 4, wherein the belt comprises a metal, a plastic, a paper, or a cloth.

13. The apparatus of claim 1, wherein the belt is configured to move in a continuous linear motion.

* * * * *